United States Patent
Regondi et al.

(10) Patent No.: US 12,224,370 B2
(45) Date of Patent: Feb. 11, 2025

(54) METHOD OF PRODUCING A SOLAR PANEL CURVED IN TWO DIRECTIONS

(71) Applicant: ATLAS TECHNOLOGIES HOLDING B.V., Helmond (NL)

(72) Inventors: Simone Regondi, Delft (NL); Durandus Kornelius Dijken, Eindhoven (NL)

(73) Assignee: LIGHTYEAR LAYER IPCO B.V., Helmond (NL)

( * ) Notice: Subject to any disclaimer, the term of this patent is extended or adjusted under 35 U.S.C. 154(b) by 688 days.

(21) Appl. No.: 17/278,568

(22) PCT Filed: Sep. 18, 2019

(86) PCT No.: PCT/EP2019/075088
§ 371 (c)(1),
(2) Date: Mar. 22, 2021

(87) PCT Pub. No.: WO2020/064474
PCT Pub. Date: Apr. 2, 2020

(65) Prior Publication Data
US 2021/0351316 A1 Nov. 11, 2021

(30) Foreign Application Priority Data
Sep. 26, 2018 (NL) ..................................... 2021711

(51) Int. Cl.
*H01L 31/18* (2006.01)
*H01L 31/048* (2014.01)
*H01L 31/05* (2014.01)

(52) U.S. Cl.
CPC ........ *H01L 31/1876* (2013.01); *H01L 31/048* (2013.01); *H01L 31/0512* (2013.01)

(58) Field of Classification Search
None
See application file for complete search history.

(56) References Cited

U.S. PATENT DOCUMENTS

2012/0255610 A1* 10/2012 Bokria ................ H01L 31/0481
 252/589
2014/0130848 A1* 5/2014 Takechi .................. H02S 20/26
 136/251

(Continued)

FOREIGN PATENT DOCUMENTS

CN 107068789 A 8/2017
DE 102004003328 A1 8/2005

(Continued)

OTHER PUBLICATIONS

Machine translation of JP2016-178120A (Year: 2016).*

(Continued)

*Primary Examiner* — Ryan S Cannon
(74) *Attorney, Agent, or Firm* — Patterson + Sheridan, LLP

(57) ABSTRACT

The invention relates to a method of producing a solar panel curved in two directions. A problem occurs when solar cells are laminated (attached) to a curved surface (such as the—transparent—roof of a car) that is, at least locally, curved in two directions. Solar cells can bend in one direction (following a cylindrical surface), but to a much smaller degree in two directions. The invention solves this problem by subdividing the multitude of solar cells (100) in subgroups (302L, 302R, 304L, 304R, 306L, 306R, 308L, 308R), each subgroup associated with an area of the curved surface (202). By choosing these subgroups such, that almost no curvature occurs in one direction, the solar cells can be bend in the perpendicular direction. To optimize the efficiency further solar cells are used where anode and cathode are positioned at one side (the side opposite to the photosensitive side), enabling flexible foil to be used for the interconnection of the solar cells in a subgroup.

7 Claims, 2 Drawing Sheets

(56) References Cited

U.S. PATENT DOCUMENTS

2014/0352764 A1     12/2014  Kim et al.
2016/0351740 A1*    12/2016  Nishio ................ H01L 31/049
2017/0141253 A1      5/2017  Ishii et al.
2018/0047863 A1*     2/2018  Jeon ....................... B32B 27/32

FOREIGN PATENT DOCUMENTS

| JP | H01196181 A |   | 8/1989  |
| JP | 09092867 A  | * | 4/1997  |
| JP | 2013258309 A |  | 12/2013 |
| JP | 2016127053 A |  | 7/2016  |
| JP | 2016178120 A | * | 10/2016 |

OTHER PUBLICATIONS

Machine translation of JP-H09-092867A (Year: 1997).*
Definition of "drape" [retrieved from https://www.merriam-webster.com/dictionary/drape on Mar. 6, 2024] (Year: 2024).*
Netherlands Search Report dated May 17, 2019, corresponding to Application No. 2021711.
International Search Report and Written Opinion dated Nov. 25, 2019, corresponding to Application No. PCT/EP2019/075088.
Japanese Office Action dated Jul. 18, 2023, for Japanese Patent Application No. 2021-542258.

* cited by examiner

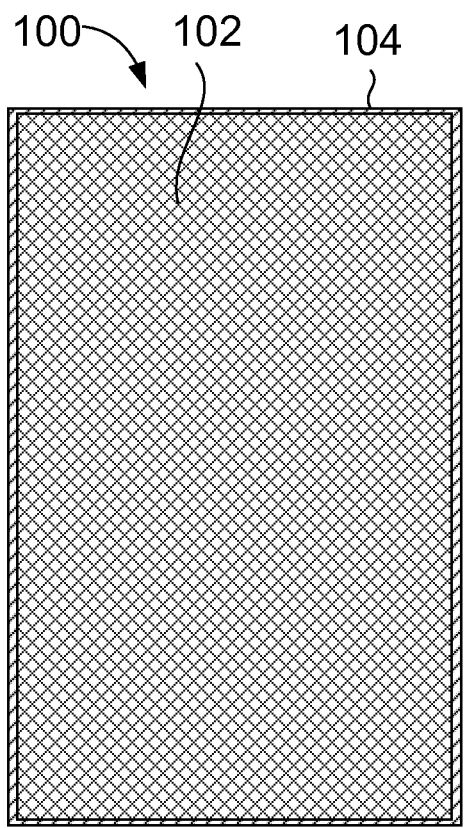
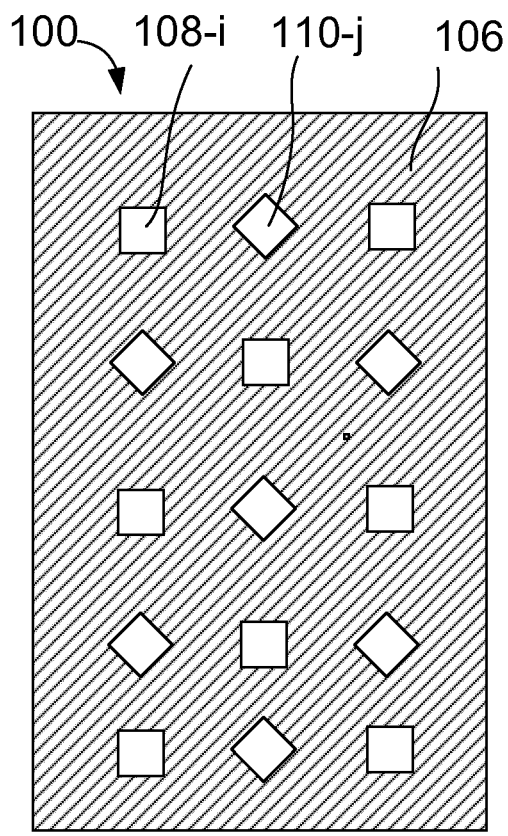
FIG. 1A  FIG. 1B
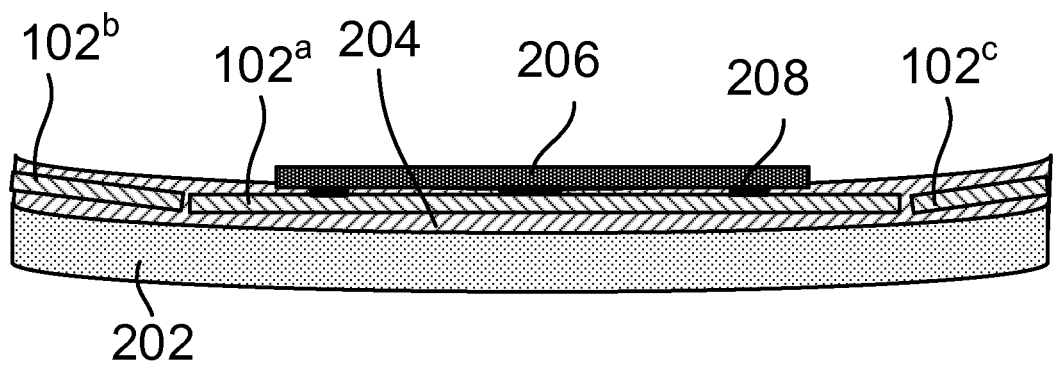
FIG. 2

METHOD OF PRODUCING A SOLAR PANEL CURVED IN TWO DIRECTIONS

TECHNICAL FIELD OF THE INVENTION

The invention relates to a method of producing a solar panel curved in two directions, the method comprising:
Providing a multitude of solar cells, the solar cells showing a photosensitive side and connections to cathode and anode on the side opposite to the photosensitive side,
Providing a curved surface, the curved surface transparent or translucent, the curved surface curved in two directions.

BACKGROUND OF THE INVENTION

In a solar panel a multitude of solar cells are interconnected, typically using 'finger electrodes', to connect the photosensitive side of one solar cell with the backside of a neighboring cell. These interconnected cells are then laminated between two sheets, for example sheets of a polyolefin or one of its copolymers, such as EVA (ethylene vinyl acetate), or polyvinylbutyral (PVB), after which the sheets are bonded to glass to form a (flat) solar panel.

It is noted that laminated in this context is also known as bonded or encapsulated (with an encapsulant). Therefore laminated, bonded and encapsulated are used interchangeable.

The solar cells are typically thin wafers of semiconductor material. Such solar cells can only be deformed into cylindrical shapes and some other shapes (e.g. cones) in a limited way due to the stresses that occur in the solar cells. If these stresses exceed the fracture limit, fracture of the solar cell occurs and may leave the cell useless.

In this context wafers of semiconductor material include mono-crystalline, poly-crystalline and amorphous wafers of silicon, GaAs, InP, or the like.

It is further noted that in this context "flexible sheet" describes a sheet of, for example, polyimide or polyester (or more generic: an insulating synthetic material) with a conductive layer or pattern thereon (typically copper, silver). When showing conductive patterns (either by etching, machining or otherwise removing conductive material or by selectively adding conductive material on an otherwise blank synthetic material) such a sheet is also known as a flexible PCB or a FCB.

Producing a solar panel that is curved in two dimensions is challenging in that the solar cells are quit brittle, and the stresses occurring when curved in two directions are much higher than when curved in only one direction. Also stress in the flexible sheet occurs when curved in two directions, possibly resulting in wrinkling or folding of the foil.

It is noted that when bonding the flexible foil and the solar cells adhered thereto to a curved surface, this may lead to breakage of cells, interconnections or joints of interconnection to cells, etc.

A solution to this problem is known from US patent application publication US2014/0130848A1. Here a standard flat sheet (a laminate) comprising solar cells is provided and incisions are made in the sheet. When the sheet is now draped over a convex form, the incisions will expand, thereby enabling curvature in two directions.

A disadvantage of this method is that the coverage of solar cells is lower due to the gaping of the incisions. Also, the use of finger electrodes will reduce to area of the solar cell available for solar conversion. Also, although this does not present a technical problem, the esthetic appearance is less than for a uniformly covered solar panel.

Another solution to this problem is known from US patent application publication US2017/0141253A1. Here groups of cells are interconnected cells using the above mentioned finger electrodes and the cells, and the publication describes how to change the length of the finger electrodes to disturb the alignment of the solar cells, after which the solar cells are laminated/bonded to the curved surface.

A disadvantage of this methods is that on a curved surface, such as a solar roof for a car, the coverage of the solar cells is less than with a flat surface. Also, the use of finger electrodes diminishes the amount of semiconductor area available for solar conversion. Also, the positioning of the cells prior to lamination is difficult, as they are positioned in an irregular matrix by the finger electrodes. Also, although this does not present a technical problem, the esthetic appearance is less than for a uniformly covered solar panel.

It is noted that, although not widely used due to their higher price, solar cells with both the anode and cathode connections on the side opposite to the photosensitive surface are known. These have a higher efficiency as the finger electrodes do not 'shade' part of the photosensitive surface (do not intercept light from the photosensitive side).

SUMMARY OF THE INVENTION

To solve the problems of the above presented solutions the present invention provides a method to overcome these problems.

To that end the method is characterized in that
Two or more flexible foils with a conductive pattern thereon are provided,
the solar cells are grouped in subgroups, each subgroup associated with an area on the curved surface and one flexible foil, the method comprising the subsequent steps of:
   a solder step comprising, for each of the subgroups, soldering the solar cells to the flexible foil or bonding the solar cells to the flexible foil with a conductive adhesive,
   a positioning step comprising draping the two or more subgroups on the curved surface,
   a final lamination step comprising laminating the subgroups to the curved surface.

It is well-known that solar cells and flexible foil can withstand some curvature in one direction, thus following (part of) a cylindrical surface, but much less when curved in two directions (locally following part of a hyperboloid surface). Some curvature in two directions is allowed, especially because of the bonding material (the lamination material) that can act as a filler and variations in the thickness of the bonding material over the size of the solar cell can "absorb" (even out) some of the curvature.

A laminate implies a maximum lamination thickness (the thickness of the initial lamination layer). However, during the laminating process, the thickness may locally change due to the viscosity of the (uncured, not yet crosslinked) lamination sheet.

During the lamination process the lamination sheet (and the embedded solar cells) are molded and cured at a pressure of, for example one atmosphere ($10$ $N/cm^2$), a temperature of between 125° C. and 145° C. and for example a time of 20 minutes. This leads to complete crosslinking of the EVA layer. Other combinations of time and temperature may be used, in which lower temperatures need a longer time for complete crosslinking (curing). It is also possible to cure at lower temperatures and shorter time periods leading to incomplete (also called partial) crosslinking, leaving the material often sticky and still partly viscous. For other lamination materials other temperatures and curing times may be used.

By dividing the multitude of solar cells in subgroups, each subgroup associated with an area on the curved surface with a small or negligible curvature in at least one direction, it is possible to form subgroups that can be bonded (laminated) to the curved surface. When properly divided in subgroups, it thus results in subgroups with a mechanical stress below the fracture limit of the solar cells and below the limit where the flexible foil shows wrinkling when laminated to the curved surface.

It is noted that the bonding material (lamination material) need not have a constant thickness between solar cell and curved surface, but for efficiency, thermal behavior and esthetic reasons the thickness preferably should not change too much over the solar cell and the multitude of solar cells.

In a solder step the solar cells are electrically and mechanically connected to the flexible foil. This step may involve soldering of, for example, solder paste at a temperature in excess of 200° C., or it may involve bonding with an electrically conductive adhesive such as an epoxy filled with conductive material, such as copper, silver, etc. Curing of such an adhesive is typically performed at a temperature of between 100-150° C., and may take place during lamination.

In a following position step each of these subgroups are then positioned (draped) on the curved surface.

In a final lamination step the subgroups, draped on the curved surface, are laminated to the curved surface.

It is noted that, although the use of a flexible foil (also known as a back-contact foil or BCF) is known (in most cases a polyester/copper foil is used, but polyimide is known for the carrier as well, and silver is known as a conductor), the use of such a foil on a curved surface (with curvature in two directions) is not, as, without the steps according to the invention, a flexible foil tends to show wrinkles when folded/draped over or in a curved surface curved in two directions, making it unfit for use under these conditions.

It is noted that US patent application publication US2017/0141253A1 relies on the variation of the length of finger electrodes, and does not hint to the use of a flexible foil together with solar cells with both anode and cathode connections at one side.

In an embodiment of the method according to the invention after the solder step and before the position step, a first lamination step is inserted, the first lamination step comprising:

For each of the subgroups laminating the solar cells and the associated flexible foil, the lamination performed at a temperature and a period that results in partial crosslinking, the positioning step comprising draping the partial crosslinked laminate comprising solar cells and flexible foil on or in the curved surface, and the final lamination step comprises laminating the partial crosslinked laminated comprising solar cells and flexible foil to the curved surface, thereby completely crosslinking the lamination applied in the first lamination step.

By partly laminating the solar cells and the flexible foil prior to the positioning step, positioning is easier as solar cells and flexible foil form an interconnected web. Also damage to the (fragile) solar cells during handling and positioning is less likely. The advantage of incomplete crosslinking is that the same lamination material can be used for the final lamination, in which in the final lamination the partial crosslinking is completed. Also, heating a totally crosslinked lamination during a final lamination step could result in reduced transparency of the first lamination layer, and degradations of the encapsulant, such as stiffening. This 'partial' lamination avoids before mentioned problems and risks.

In an embodiment of the method according to the invention after the solder step and before the position step, a first lamination step is inserted, the first lamination step comprising:

laminating the solar cells and the associated flexible foil, the lamination performed at a temperature and a period that results in complete crosslinking, the position step comprising draping the laminated subgroups on or in the curved surface, and the final laminating step comprises laminating the laminated subgroups to the curved surface.

This embodiment resembles to embodiment described before, with the difference that a complete crosslinking occurred in the first lamination step. To avoid reduction of transparency of the lamination material, a tight control of temperature and time is needed, but this may be preferred as the intermediate product (a laminated web of solar cells and flexible foil) is better to handle as it is less sticky than an incompletely cured (a partially cured) lamination sheet, and offers better protection of the solar cells.

In another embodiment of the method according to the invention in which during the final lamination step between the laminated subgroups and the curved surface more layers of lamination material (encapsulant) are placed and laminated thereto.

This embodiment described the possibility to place multiple layers of lamination material (for example layers of EVA-ethylene vinyl acetate-) between the solar cells and the curved surface, which results in more lamination material (encapsulant material) that may show local thickness variations, resulting in reduced mechanical stress.

In yet another embodiment of the method according to the invention at least during the solder step the two or more flexible foils are laying in one flat plane.

Handling the flexible foils and solar cells while in a flat plane enables fabrication in standard soldering apparatuses.

It is noted that, as not all subgroups need to be produced at the same moment, not all flexible foils need to be laying in a flat plane at the same time, as the moment when the solder step is performed may differ for each subgroup.

In still another embodiment of the method according to the invention the method further comprises: before providing the solar cells estimating the mechanical stress occurring in the solar cells resulting from the curvature of the curved surface at the location of the solar cell and, based on this estimate, resize the solar cells to such a size that the mechanical stress in each solar cell is below the stress where fracture of the solar cells occurs.

Determining the size (the maximum area) of a subgroup is best done with an iterative recipe, starting with a first size of solar cells, determine in a simulation what stresses result when the cells are forced to follow the curved surface, if the stresses are too high with what is assumed to be an allowable maximum (for example half the fracture limit of the solar cell), lower the size of the solar panels in the direction where the high stress occurred, etc.

In yet another embodiment of the method according to the invention the method further comprises: before providing the solar cells estimating the mechanical stress occurring in the solar cells resulting from the curvature of the curved surface at the location of the solar cell and, based on this estimate, at least locally change the thickness of laminate material to such a value that the stresses occurring in the solar cell are below the stress where fracture of the solar cells occurs.

By at least locally changing the thickness of the lamination material, the stresses occurring in the solar cells can be reduced due to the viscosity of uncured lamination material. Local variation of the thickness of the lamination material can be realized by building a 3D form of material by locally adding rings, circles or other forms before curing the lamination material. It is noted that locally adding material may be used to reach this solution, but also using a thicker layer of encapsulant (lamination material, or the use of several layers, as the encapsulant will during the lamination process slightly. 3D forming of for example EVA may be realized by placing one or more sheets upon each other, where at least one sheet shows perforations or the like. Also 3D printing of EVA is known.

BRIEF DESCRIPTION OF THE DRAWINGS

The invention is now elucidated using figures, in which identical reference signs indicate corresponding features. To that end:

FIG. 1A schematically shows a solar cell used in the invention, seen from the photosensitive side, FIG. 1B schematically shows a solar cell used in the invention, seen from the side opposite to the photosensitive side, FIG. 2 schematically shows one possible cut-through of a solar panel fabricated according to the invention.

DETAILED DESCRIPTION OF THE INVENTION

Figure 3A:
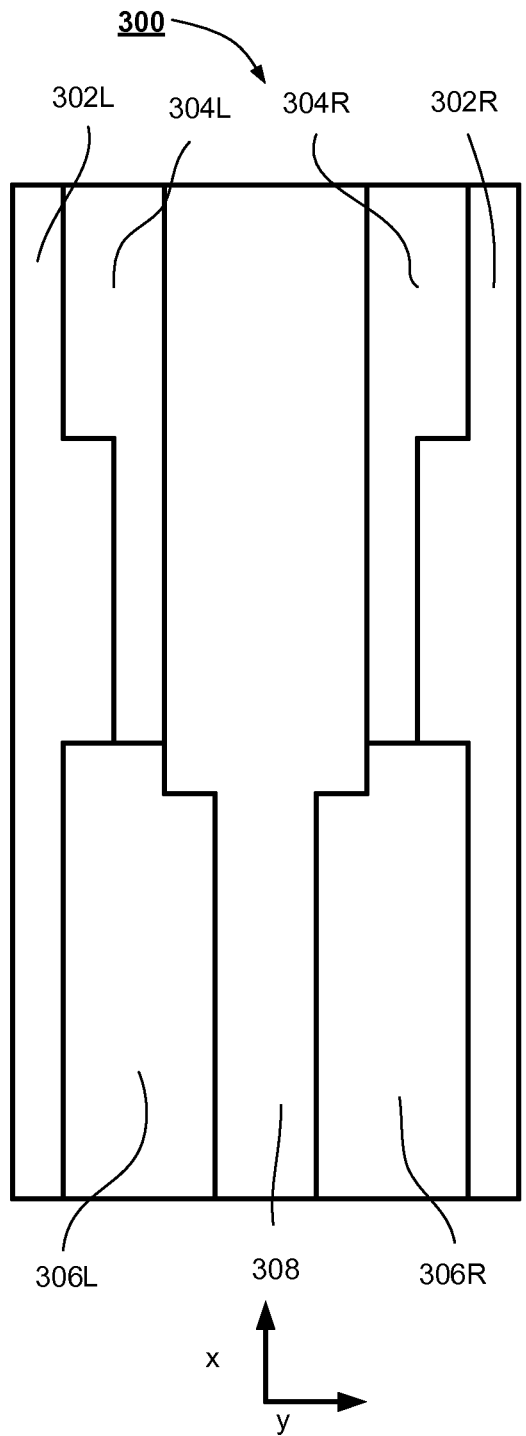
FIG. 3A schematically shows a planar view of solar panel, showing the areas forming each subgroup, FIG. 3B schematically shows a planar view of solar panel, showing the solar cells forming each subgroup.

FIG. 1A schematically shows a solar cell used in the invention, seen from the photosensitive side.

FIG. 1A schematically shows a solar cell 100 used in the invention. The solar cell shows a photosensitive area 102 and an insulating edge portion 104. It is noted that this insulated portion (actually an insulating side wall) only occurs at so-called passivated cells. An advantage is that it enables the cells to be placed against each other. Cells without passivation on the sides must be separated to avoid shorts. Most commercially available cells are cut from a large wafer and do not show a passivation of the side walls, so they need to be spaced from each other to avoid electrical shorting.

A typical thickness for a solar cell is in the order of 200 µm, but for more flexible solar cells thinner cells, for example with a thickness of 150 µm, are preferred.

FIG. 1B schematically shows a solar cell used in the invention, seen from the side opposite to the photosensitive side.

On an otherwise insulating surface 106 cutouts are provided that provide contact areas to anode 108-$i$ and cathode 110-$j$.

FIG. 2 schematically shows one possible cut-through of a solar panel fabricated according to the invention.

A curved surface 202 in the form of, e.g., the glass roof of a car, is bonded with a cross-linked layer 204 of lamination material, for example EVA (Ethylene Vinyl Acetate) or a polyolefin to solar cells $102^a$. The photosensitive side is facing the glass.

The flexible foil comprises a polyester or polyimide film 206 and copper tracks 208. The solar cell is soldered on a flexible foil, either by soldering the cells and the flexible foil with solder paste that is heated to, for example, 200° C. or more, or by using electrically conductive adhesive (typically a metal filled epoxy) that is cured at a temperature of, for example, less than 150° C.

Solar cells $102^b$ and $102^c$ are here depicted as belonging to another subgroup (the flexible foil—although not depicted for these cells—is not the same as the flexible foil of cell $102^a$.

It is noted that between the flexible foil and the solar cells a further layer of material can be placed, either as a solder mask (or a mask for electrically conductive adhesive), or as an esthetic screen to obscure the copper tracks on the flexible foil, or for any other purpose. This need not be a transparent material. A lamination layer may be added on this layer (thereby completely encapsulating the flexible foil), but is not necessary.

Also the flexible foil may comprise only one layer of insulating material as a carrier, such as polyimide or polyester, with a conductive pattern thereon, or it may comprise further layers with or without cut-outs to act as a solder mask, or for other purposes, the further layers either on the side of the solar cells or on the opposite side.

The amount of lamination material (bonding material, encapsulant) between the solar cell may be the result of one lamination layer but may comprise several layer of lamination material.

It is further noted that a bonding layer (a lamination layer) between curved surface (glass) and solar cells is necessary, but a lamination layer covering the flexible foil is not essential to the invention.

FIG. 3A schematically shows a planar view of solar panel, showing the areas forming each subgroup.

FIG. 3A shows a curved surface 300 that is divided in areas 302L, 302R, 304L, 304R, 306L, 306R and 308.

The distribution of the curved surface is the result of an analysis of the maximum stresses occurring when flexible foil and solar cells are adhered (laminated) to the curved surface. These stresses can occur in any direction, but in many applications (such as a car roof) there is an axis of symmetry (here the x-axis) simplifying the problem. Empirically (or using another method, for example computer based) a division of areas is then found that result in acceptable stresses for both the solar cells and the foils.

It is noted that, although related, a stress problem in a solar cell need not result in a problem in the flexible foil, and vice versa: the size of a solar cell is often much more limited than the (maximum) size of a flexible foil. Therefore, at modest curvatures a problem may first occur in the flexible foil. However, at a large local curvature may result in a problem in the solar cells before a problem in the flexible foil occurs.

Figure 3B:
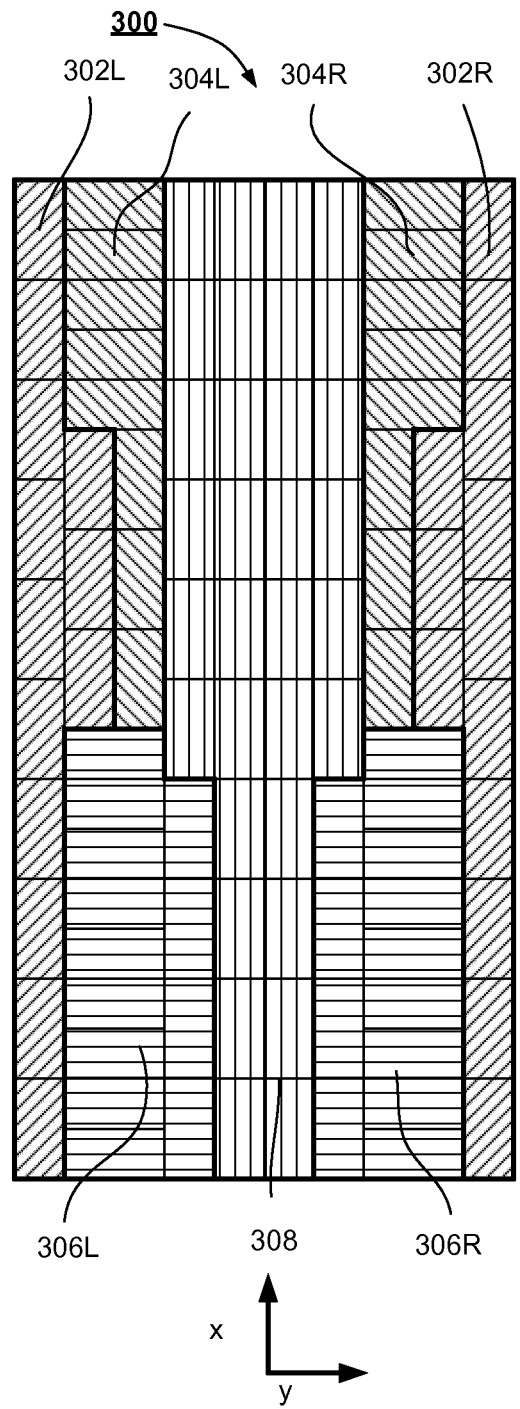

FIG. 3B schematically shows a planar view of solar panel, showing the solar cells forming each subgroup.

FIG. 3B can be thought to be derived from FIG. 3A. Here the solar cells are depicted that form the subgroups (borders of subgroups indicated by thicker lines). As can be seen also the orientation of the cells can be changed, even within a subgroup, as shown in for example group 304L.

It is remarked that the definition of subgroup used here has no relation to the definition of "group" usually used in solar technology. The standard definition of group comprises a group of cells, typically being part of a string, and in state of the art panels each group is associated with an optimizer (a Maximum Power Point Tracker). The definition of subgroup according to the invention is used to denote cells that are attached to a (doubly) curved surface without exceeding predetermined stress levels. This implies that one subgroup may comprise more than one group, or one group may extend over more than one subgroup, or any combination thereof. It is thus possible that two subgroups comprise three groups or vice versa, while each group may be associated with its own optimizer.

It is further remarked that typically the curved surface is a transparent or translucent curved surface, but it is also possible to use the method with a non-transparent curved surface (for example a metal curved surface) and that the photosensitive side of the solar cells are most removed from the curved surface. In that case the flexible foils need to be placed between the curved surface and the solar cells However, this is in most cases a less robust solution as the lamination material is softer and more prone to scratches and abrasion.

It is also remarked that electrical connections between one flexible foil to another flexible foil, or to other PCB's or FBC's, can be made by soldering or bonding another flexible foil (preferably formed as a strip with several lines forming the electrical connections) on the first flexible foil. Also electrical connections via wires can be used.

It is noted that, in the context of this invention, laminating may describe a total encapsulation, but may also describe bonding one part (for example the solar cells) to another (for example the curved surface) using a bonding or lamination material, such as of a polyolefin or one of its copolymers, such as EVA (ethylene vinyl acetate), or polyvinylbutyral (PVB). For example, after the final lamination step defined earlier, the flexible foil may or may not be covered with lamination material.

An exemplary curing cycle is, for example,
form a sandwich of a sheet of EVA, the solar cells, the flexible foil and another sheet of EVA layer in a vacuum oven that is heated to 140° C.,
evacuate for 3½ minutes,
while evacuated press on the sandwich with a pressure of approximately 1 atmosphere using a silicon membrane,
cure in this condition for 17 minutes,
remove pressure,
ventilate for 30 seconds,
open the oven and remove the sandwich.
This results in a fully cured (fully crosslinked) sandwich. A partial crosslinked sandwich is obtained by reducing the time for curing to 8 minutes.

Laminating the before described sandwich to a curved surface, such as the glass roof of a solar car, is done by, for example:
Place the glass roof, an uncured sheet of EVA and the previously made and cured sandwich comprising solar cells and flexible foil, in an evacuable bag,
evacuate the bag (thereby applying a pressure of one atmosphere to the contents of the bag),
heat the bag to a temperature of 100° C. during a time of 40 minutes,
gradually heat the bag further to a temperature of 130° C. in a ramp-up time of 15 minutes,
cure for 20 minutes at the temperature of 130° C. and cool down.
It is noted that experiments show no degradation of the already fully crosslinked sandwich.

The invention claimed is:

1. A method of producing a solar panel curved in two directions, the method comprising:
    providing a multitude of solar cells, the solar cells showing a photosensitive side and connections to anode and cathode on the side opposite to the photosensitive side;
    providing a curved surface, the curved surface transparent or translucent, the curved surface at least locally curved in two directions;
    providing two or more flexible foils of an insulating synthetic material with a conductive pattern thereon,
    the solar cells are grouped in subgroups, each subgroup associated with an area on the curved surface and one flexible foil;
    a solder step comprising, for each of the subgroups, soldering the solar cells of said subgroup to the flexible foil associated with said subgroup or bonding the solar cells of said subgroup to the flexible foil associated with said subgroup with a conductive adhesive;
    a positioning step comprising draping the two or more subgroups, each of the subgroups being soldered to or bonded to the flexible foil that is associated with said subgroup, on or in the curved surface; and
    a final lamination step comprising laminating the subgroups to the curved surface.

2. The method of claim 1, in which after the solder step and before the positioning step a first lamination step is inserted, the first lamination step comprising:
    for each and all subgroups laminating the solar cells and the associated flexible foil, the lamination performed at a temperature and a period that does not result in complete crosslinking;
    the positioning step comprising draping the laminated subgroups on or in the curved surface; and
    the final lamination step comprises laminating the first laminated subgroups to the curved surface, thereby completely crosslinking the lamination applied in the first lamination step.

3. The method of claim 1, in which after the solder step and before the positioning step a first lamination step is inserted, the first lamination step comprising:
    for each and all subgroups laminating the solar cells and the associated flexible foil, the lamination performed at a temperature and a period that results in complete crosslinking;
    the positioning step comprising draping the laminated subgroups on or in the curved surface; and
    the final lamination step comprises laminating the first laminated subgroups to the curved surface.

4. The method of claim 1, in which, during the final lamination step, between the subgroups and the curved surface, several layers of lamination material are placed and laminated thereto.

5. The method of claim 1, in which at least during performing the soldering step the two or more flexible foils are laying in one flat plane.

6. The method of claim 1, the method further comprising:
    before providing the multitude of solar cells estimating the mechanical stress occurring in the solar cells of each subgroup and the associated flexible foil resulting from the curvature of the curved surface at the location of the solar cells and, based on this estimate, resize the solar cells to such a size that the mechanical stress in each solar cell is less than the mechanical stress at which fracture occurs.

7. The method of claim 1, the method further comprising:
    before providing the multitude of solar cells estimating the mechanical stress occurring in the solar cells of each subgroup resulting from the curvature of the curved surface at the location of the solar cells and, based on this estimate, at least locally change the thickness of laminate material to such a value that the stresses occurring in the solar cells are below the stress where fracture of the solar cells occurs.

\* \* \* \* \*